United States Patent
Das et al.

(10) Patent No.: US 8,299,371 B2
(45) Date of Patent: Oct. 30, 2012

(54) CIRCUITIZED SUBSTRATE WITH DIELECTRIC INTERPOSER ASSEMBLY AND METHOD

(75) Inventors: Rabindra N. Das, Vestal, NY (US);
John M. Lauffer, Waverly, NY (US);
Voya R. Markovich, Endwell, NY (US);
James J. McNamara, Jr., Endwell, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 12/972,700

(22) Filed: Dec. 20, 2010

(65) Prior Publication Data

US 2012/0152605 A1    Jun. 21, 2012

(51) Int. Cl.
*H05K 1/11* (2006.01)

(52) U.S. Cl. ........ 174/262; 174/250; 174/255; 174/256; 174/260; 174/261; 361/793; 361/794; 338/195; 338/309; 29/620; 29/852

(58) Field of Classification Search ................. 174/262, 174/250, 255, 256, 260, 261; 361/793, 794; 338/195, 309; 29/620, 852
See application file for complete search history.

(56) References Cited

U.S. PATENT DOCUMENTS

| | | | | |
|---|---|---|---|---|
| 4,927,742 A * | 5/1990 | Kohm | ............................ | 430/311 |
| 5,887,345 A * | 3/1999 | Kulesza et al. | ................... | 29/852 |
| 5,993,593 A * | 11/1999 | Swartz et al. | ................ | 156/308.4 |
| 6,194,024 B1 * | 2/2001 | Arldt et al. | .................... | 427/97.2 |
| 6,225,570 B1 * | 5/2001 | Ishiyama et al. | ............... | 174/260 |
| 6,280,907 B1 * | 8/2001 | Chung et al. | ................... | 430/313 |
| 6,336,049 B1 * | 1/2002 | Kinbara et al. | ................ | 607/148 |
| 6,353,540 B1 * | 3/2002 | Akiba et al. | ................... | 361/794 |
| 6,388,204 B1 | 5/2002 | Lauffer et al. | | |
| 6,459,461 B1 * | 10/2002 | Umemoto et al. | ............... | 349/65 |
| 6,465,084 B1 | 10/2002 | Curcio et al. | | |
| 6,479,093 B2 | 11/2002 | Lauffer et al. | | |
| 6,504,111 B2 | 1/2003 | Curcio et al. | | |
| 6,570,102 B2 | 5/2003 | Miller et al. | | |
| 6,570,477 B2 * | 5/2003 | Park et al. | ...................... | 336/200 |
| 6,593,534 B2 | 7/2003 | Jones et al. | | |
| 6,634,543 B2 | 10/2003 | Curcio et al. | | |
| 6,638,607 B1 | 10/2003 | Curcio et al. | | |
| 6,645,607 B2 | 11/2003 | Curcio et al. | | |
| 6,680,440 B1 * | 1/2004 | Russell et al. | ................. | 174/260 |
| 6,790,305 B2 | 9/2004 | Curcio et al. | | |
| 6,795,139 B1 * | 9/2004 | Kameyama et al. | ............ | 349/96 |
| 6,809,269 B2 | 10/2004 | Fuller, Jr. et al. | | |
| 6,812,412 B2 * | 11/2004 | Obata et al. | .................... | 174/261 |
| 6,826,830 B2 | 12/2004 | Egitto et al. | | |
| 6,872,894 B2 | 3/2005 | Fuller, Jr. et al. | | |
| 6,900,392 B2 | 5/2005 | Fuller, Jr. et al. | | |
| 6,955,849 B2 | 10/2005 | Curcio et al. | | |
| 6,969,436 B2 | 11/2005 | Curcio et al. | | |
| 6,995,322 B2 | 2/2006 | Chan et al. | | |
| 7,047,630 B2 | 5/2006 | Fuller, Jr. et al. | | |

(Continued)

*Primary Examiner* — Xiaoliang Chen

(74) *Attorney, Agent, or Firm* — Mark Levy; Hinman, Howard & Kattell, LLP

(57) ABSTRACT

A circuitized substrate and method of making same in which quantities of thru-holes are formed within a dielectric interposer layer. The substrate includes two printed circuit board (PCB) layers bonded to opposing sides of the interposer with electrically conductive features of each PCB aligned with the interposer thru-holes. Resistive paste is positioned on the conductive features located adjacent the thru-holes to form controlled electrically resistive connections between conductive features of the two PCBs. A circuitized substrate assembly and method of making same are also disclosed.

10 Claims, 6 Drawing Sheets

U.S. PATENT DOCUMENTS

| | | |
|---|---|---|
| 7,071,423 B2 | 7/2006 | Fuller, Jr. et al. |
| 7,076,869 B2 | 7/2006 | Curcio et al. |
| 2002/0005541 A1* | 1/2002 | Park et al. .................. 257/306 |
| 2002/0015293 A1* | 2/2002 | Akiba et al. ................ 361/793 |
| 2004/0000425 A1* | 1/2004 | White et al. ................ 174/250 |
| 2004/0187297 A1* | 9/2004 | Su et al. ........................ 29/620 |
| 2005/0100719 A1* | 5/2005 | Kanakarajan et al. ........ 428/209 |
| 2005/0231304 A1* | 10/2005 | White et al. ................ 333/185 |
| 2005/0248418 A1* | 11/2005 | Govind et al. ................ 331/179 |
| 2006/0049913 A1* | 3/2006 | Kang et al. ................... 338/309 |
| 2007/0006452 A1 | 1/2007 | Egitto et al. |
| 2007/0007033 A1 | 1/2007 | Das et al. |
| 2007/0085108 A1* | 4/2007 | White et al. .................. 257/173 |
| 2007/0085654 A1* | 4/2007 | Bhattacharya et al. ....... 338/195 |
| 2007/0296534 A1* | 12/2007 | Carastro et al. ............... 336/200 |

\* cited by examiner

CIRCUITIZED SUBSTRATE WITH DIELECTRIC INTERPOSER ASSEMBLY AND METHOD

FIELD OF THE INVENTION

The present invention relates to circuitized substrates, and more particularly to multilayered circuitized structures such as printed circuit boards (PCBs) and chip carriers, and is particularly related to a PCB structure that utilizes resistor material placed between separated conductive sites prior to lamination, and to a method of making same.

BACKGROUND OF THE INVENTION

A common method of forming a multi-layered circuitized substrate involves forming sub-composites each including an individual layer of dielectric material and a layer of electrically conducting material thereon, and then forming electrical circuit patterns in the electrically conductive layer. The conducting material, typically copper, provides signal and voltage planes, as needed. The signal planes are typically in discrete wiring patterns. Voltage planes can be either ground or power planes, and are sometimes collectively referred to as power planes. If required, thru-holes are formed within this sub-composite structure by drilling or etching. This method relies on each successive step of adding additional dielectric layers and then forming circuitry thereon, until the desired number of conductive planes has been formed. Thru-holes may be formed upon completion of each of these successive steps, and it is also possible to form thru-holes through the entire thickness of the final multilayered composite. This requires precise drilling to form the holes at each step (if desired) in addition to the final hole formation step if holes extend through the entire thickness.

The teachings of the present invention are not limited to the manufacture of high speed substrates such as PCBs and the like, however, but are also applicable to the manufacture of substrates used for other purposes than high speed signal connections. Generally speaking, the teachings herein are applicable to any such substrates in which one or more conductive layers such as copper are bonded (e.g., laminated) to an adjacent dielectric layer and the resulting composite then used as the substrate, typically when combined with other dielectric and conductive layers to form a thicker, built-up structure. The invention is able to provide a final structure in which top pad to bottom pad resistance connectivity is controlled while still assuring effective conductive layer and dielectric layer adhesion.

DISCUSSION OF RELATED ART

In U.S. Pat. No. 6,388,204, issued May 14, 2002 to Lauffer et al. and entitled COMPOSITE LAMINATE CIRCUIT STRUCTURE AND METHODS OF INTERCONNECTING THE SAME, there is described a laminate circuit structure assembly that comprises what are described as modularized circuitized plane subassemblies, and a joining layer located between each of the subassemblies wherein the subassemblies and joining layer are bonded together with a cured dielectric from a bondable, curable dielectric. The subassemblies and joining layer are electrically interconnected with bondable electrically conductive material. The joining layer comprises dielectric layers disposed about an internal electrically conductive layer. The electrically conductive layer has a via (a conductive hole) and the dielectric layers each have a via of smaller diameter than the vias in the electrically conductive layer and are aligned with the vias in the electrically conductive layer. The vias are filled with electrically bondable electrically conductive material for providing electrical contact between the subassemblies.

In U.S. Pat. No. 6,465,084, issued Oct. 15, 2002 to Curcio, et al. and entitled METHOD AND STRUCTURE FOR PRODUCING Z-AXIS INTERCONNECTION ASSEMBLY OF PRINTED WIRING BOARD ELEMENTS, there is described a method of forming a core for and forming a composite wiring board. The core has an electrically conductive coating on at least one face thereof. At least one opening is formed through the structure extending from one face to the other and through each conductive coating. An electrically conductive material is dispensed in each of the openings extending through the conducting coating. At least a portion of the surface of the conductive coating on one face is removed to allow a nub of the conductive material to extend above the substrate face and any remaining conductive material to thereby form a core that can be electrically joined face-to-face with a second core member or other circuitized structure.

In U.S. Pat. No. 6,479,093, issued Nov. 12, 2002 to Lauffer et al., and entitled COMPOSITE LAMINATE CIRCUIT STRUCTURE AND METHODS OF INTERCONNECTING THE SAME, there is described a method of making the laminate circuit structure assembly of U.S. Pat. No. 6,388,204. (U.S. Pat. No. 6,479,093 is a divisional application of U.S. Pat. No. 6,388,204.)

In U.S. Pat. No. 6,504,111, issued Jan. 7, 2003 to Curcio et al. and entitled SOLID VIA LAYER TO LAYER INTERCONNECT, there is described a structure for interconnecting between layers of a multilayer circuit board. The structure comprises a stack that includes at least one layer and a via (hole) opening that extends through at least one layer of the stack. Each individual via opening is filled with a solid conductive plug and each solid conductive plug has a first contact pad and a second contact pad.

In U.S. Pat. No. 6,570,102, issued May 27, 2003 to Miller et al. and entitled STRUCTURE FOR HIGH SPEED PRINTED WIRING BOARDS WITH MULTIPLE DIFFERENTIAL IMPEDANCE-CONTROLLED LAYER, there is described a method and arrangement for creating an impedance controlled printing wiring board, particularly the formation of a structure for high speed printed wiring boards incorporating multiple differential impedance controlled layers. This patent further describes providing holes which are filled with a conductive paste material to form electrical interconnections with conductive layers of the printed wiring board.

In U.S. Pat. No. 6,593,534, issued Jul. 15, 2003 to Jones et al. and entitled PRINTED WIRING BOARD STRUCTURE WITH Z-AXIS INTERCONNECTIONS, there is described a structure and method for producing a multilayer printed or wiring circuit board having so-called "z-axis" or multilayer electrical interconnections in a hierarchical wiring structure in order to be able to provide for an increase in the number of inputs and outputs in comparison with a standard printed circuit board arrangement.

In U.S. Pat. No. 6,634,543, issued Oct. 21, 2003 to Curcio et al. and entitled METHOD OF FORMING METALLIC Z-INTERCONNECTS FOR LAMINATE CHIP PACKAGES AND BOARDS, there is described the deterioration and damage to insulator materials in an interconnection structure having vertical connections. Damage is avoided by performing diffusion bonding of metal pads at plated thru-holes (PTHs) at temperatures below the melting points of conductive material in the bond. Diffusion bonding is achieved during time periods required for processing (e.g., curing or drying) insulating materials in the laminated structure.

In U.S. Pat. No. 6,638,607, issued Oct. 28, 2003 and entitled METHOD AND STRUCTURE FOR PRODUCING Z-AXIS INTERCONNECTION ASSEMBLY OF PRINTED WIRING BOARD ELEMENTS, there is described a method of forming a composite wiring board, using a "member," which includes a dielectric substrate. Adhesive tape is applied to at least one face of this substrate and at least one opening is formed through the substrate extending from one face to the other and through each adhesive tape. An electrically conductive material is dispensed in each of the openings and partially cured. The adhesive tape is removed to allow a nub of the conductive material to extend above the substrate face to form a wiring structure with other elements.

In U.S. Pat. No. 6,645,607, issued Nov. 11, 2003 to Curcio et al. and entitled METHOD AND STRUCTURE FOR PRODUCING Z-AXIS INTERCONNECTION ASSEMBLY OF PRINTED WIRING BOARD ELEMENTS, there is described a method of forming a "core" for use as part of a composite wiring board. The core has an electrically conductive coating on at least one face of a dielectric substrate. At least one opening is formed through the substrate extending from one face to the other and through each conductive coating. An electrically conductive material is dispensed in each of the openings extending through the conducting coating. At least a portion of the surface of the conductive coating on one face is removed to allow a nub of the conductive material to extend above the substrate face and any remaining conductive material to thereby form a core that can be electrically joined face-to-face with a second core member or other circuitized structure.

In U.S. Pat. No. 6,790,305, issued Sep. 14, 2004 to Curcio et al. and entitled METHOD AND STRUCTURE FOR SMALL PITCH Z-AXIS ELECTRICAL INTERCONNECTIONS, there is described a method for producing small pitch "z-axis" electrical interconnections in layers of dielectric materials which are applied to printed wiring boards and diverse electronic packages. In this method, parallel fabrication of intermediate structures occurs such that the structures are subsequently joined to form a final structure. In addition, there is provided a "z-interconnected" electrical structure, employing dielectric materials such as resin coated copper, employable in the manufacture of diverse type of electronic packages, including printed circuit boards, multi-chip modules and the like.

In U.S. Pat. No. 6,809,269, issued on Oct. 26, 2004 to Fuller, Jr., et al. and entitled CIRCUITIZED SUBSTRATE ASSEMBLY AND METHOD OF MAKING SAME, there is described a circuitized substrate assembly and "z-interconnect" method for making same wherein the assembly includes individual circuitized substrates bonded together. The substrates each include at least one opening, only one of which is substantially filled with a conductive paste prior to bonding. Once bonded, the paste is also partially located within the other opening to provide an effective electrical connection therewith.

In U.S. Pat. No. 6,826,830, issued on Dec. 7, 2004 to Egitto et al. and entitled MULTI-LAYERED INTERCONNECT STRUCTURE USING LIQUID CRYSTALLINE POLYMER DIELECTRIC, there is described a multi-layered interconnect structure and method of formation. In a first embodiment, first and second liquid crystal polymer dielectric layers are directly bonded, respectively, to first and second opposing surface of a thermally conductive layer, with no extrinsic adhesive material bonding the thermally conductive layer with either the first or second dielectric layer. In a second embodiment, first and second substructures are directly bonded, respectively, to first and second opposing surfaces of a dielectric joining layer, with no extrinsic adhesive material bonding the dielectric joining layer with either the first or second substructures.

In U.S. Pat. No. 6,872,894, issued Mar. 29, 2005 to Fuller, Jr. et al. and entitled INFORMATION HANDLING SYSTEM UTILIZING CIRCUITIZED SUBSTRATE, there is described an information handling system (e.g., computer, server, etc.) utilizing at least one circuitized substrate assembly of robust construction and possessing enhanced operational capabilities. The substrate assemblies include a substrate having at least one opening which is substantially filled with a conductive paste prior to bonding.

In U.S. Pat. No. 6,900,392, a divisional application of U.S. Pat. No. 6,872,894, issued May 31, 2005 to Fuller, Jr., et al. and entitled INFORMATION HANDLING SYSTEM UTILIZING CIRCUITIZED SUBSTRATE, there is also described an information handling system utilizing at least one circuitized substrate assembly that includes a substrate having at least one opening which is substantially filled with a conductive paste prior to bonding.

In U.S. Pat. No. 6,955,849, ISSUED Oct. 18, 2005 to Curcio et al. and entitled METHOD AND STRUCTURE FOR SMALL PITCH Z-AXIS ELECTRICAL INTERCONNECTIONS, there is described a method for producing small pitch z-axis electrical interconnections in layers of dielectric materials which are applied to printed circuit boards and other electronic packages. A method for parallel fabrication of intermediate structures which are subsequently joined to form a final structure is also discussed. In addition, there is provided a "z-interconnected" electrical structure employing dielectric materials such as resin coated copper, employable in the manufacture of diverse type of electronic packages.

In U.S. Pat. No. 6,969,436, issued Nov. 29, 2005 to Curcio et al., and entitled METHOD AND STRUCTURE FOR PRODUCING Z-AXIS INTERCONNECTION ASSEMBLY OF PRINTED WIRING BOARD ELEMENTS, there is described a method of forming a member for joining to a composite wiring board. The member includes a dielectric substrate. Adhesive tape is applied to at least one face of said substrate. At least one opening is formed through the substrate extending from one face to the other and through each adhesive tape. An electrically conductive material is dispensed in each of the openings and partially cured. The adhesive tape is removed to allow a nub of the conductive material to extend above the substrate face to form a wiring structure with other elements.

In U.S. Pat. No. 6,995,322, issued Feb. 7, 2006 to Chan et al. and entitled HIGH SPEED CIRCUITIZED SUBSTRATE WITH REDUCED THRU-HOLE STUB, METHOD FOR FABRICATION AND INFORMATION HANDLING SYSTEM UTILIZING SAME, there is described a circuitized substrate including a plurality of conductive and dielectric layers and also a plurality of conductive thru-holes therein for passing high speed signals, from one component to another mounted on the substrate. The substrate utilizes a signal routing pattern which uses the maximum length of each of the thru-holes wherever possible to thereby substantially eliminate signal loss (noise) due to thru-hole "stub" resonance. A multilayered circuitized substrate assembly using more than one circuitized substrate, an electrical assembly using a circuitized substrate and one or more electrical components, a method of making the circuitized substrate and an information handling system incorporating one or more circuitized substrate assemblies and attached components are also provided.

In U.S. Pat. No. 7,047,630, issued May 23, 2006 to Fuller, Jr., et al. and entitled METHOD OF MAKING CIRCUITIZED SUBSTRATE ASSEMBLY, there is described a circuitized substrate assembly and method for making same wherein the assembly includes individual circuitized substrates bonded together. The substrates each include at least one opening, only one of which is substantially filled with a conductive paste prior to bonding. Once bonded, the paste is also partially located within the other opening to provide an effective electrical connection therewith.

In U.S. Pat. No. 7,071,423, issued Jul. 4, 2006 to Fuller, Jr., et al. and entitled CIRCUITIZED SUBSTRATE ASSEMBLY AND METHOD OF MAKING SAME, there is described a circuitized substrate assembly and "z-interconnect" method for making same wherein the assembly includes individual circuitized substrates bonded together. The substrates each include at least one opening, only one of which is substantially filled with a conductive paste prior to bonding. Once bonded, the paste is also partially located within the other opening to provide an effective electrical connection therewith.

In U.S. Pat. No. 7,076,869, issued Jul. 18, 2006 to Curcio et al. and entitled SOLID VIA LAYER TO LAYER INTERCONNECT, there is described a method for providing an interconnect structure for use between layers of a multilayer circuit board. A first via (hole) extending through a total thickness of a first layer is formed. The first via is totally filled with a first solid conductive plug; an end of the first solid conductive plug includes a first contact pad that is in contact with a surface of the first layer. A second via extending through a total thickness of a second layer is formed. The second via totally filling with a second solid conductive plug; an end of the second solid conductive plug includes a second contact pad that is in contact with a surface of the second layer. The second layer is electrically and mechanically coupled to the first layer by an electrically conductive adhesive that is in electrical and mechanical contact with both the end of the first plug and the end of the second plug.

In U.S. Patent Publication 2007/0006452, filed Jan. 11, 2007 by Egitto et al. and entitled METHOD OF MAKING A CIRCUITIZED SUBSTRATE WITH SINTERED PASTE CONNECTIONS AND MULTILAYERED SUBSTRATE ASSEMBLY HAVING SAID SUBSTRATE AS PART THEREOF there is described a method of making a circuitized substrate which includes a high temperature dielectric material in combination with a low temperature conductive paste, the paste including an organic binder component and at least one metallic component. The flakes of the metallic component are sintered to form a conductive path through the dielectric when the dielectric is used as a layer in the substrate.

In U.S. Patent Publication 2007/0007033, filed by Das et al. and entitled CIRCUITIZED SUBSTRATE WITH SOLER-COATED MICROPARTICLE PASTE CONNECTIONS, MULTILAYERED SUBSTRATE ASSEMBLY, ELECTRICAL ASSEMBLY AND INFORMATION HANDLING SYSTEM UTILIZING SAME AND METHOD OF MAKING SAID SUBSTRATE there is described a circuitized substrate which includes a conductive paste for providing electrical connections. The paste, in one embodiment, includes a binder component and at least one metallic component including micro particles. In another embodiment, the paste includes the binder and a plurality of nano-wires. Selected ones of the micro particles or nano-wires include a layer of solder thereon. A method of making such a substrate is also provided, as are an electrical assembly and information handling system adapter for having such a substrate as part thereof.

U.S. Pat. Nos. 6,809,269, 6,872,894, 6,900,392, 6,995,322, 7,047,630, 7,071,423, and the inventions defined in U.S. Patent Publications 2007/0006452 and 2007/0007033 are assigned to the same Assignee as the present invention. The teachings of these documents are incorporated herein by reference.

The previously outlined United States issued patents and published patent applications fail to adequately describe or disclose the present invention.

In view of the foregoing and other problems and disadvantages of conventional methods, an object of the present invention is to provide a method in which two or more subassemblies are aligned and bonded together with resistor material between flanking conductors.

Another object of the present invention is to provide an interposer having a drilled, flowable dielectric substrate. During lamination, a resistive material is constrained from dissipating from its position between two conductors of separate dielectric layers.

Still another object of the present invention is to provide a method of manufacturing involving an interposer having a dielectric substrate. A void is formed by drilled holes and results in resistive paste connections being restrictively formed between respective pairs of conductors. The method has good yield, relatively low cost and uses standard IC fabrication processes.

A further object of the present invention is to provide resistor material bonded between the conductors of separate dielectric layers. The effectively formed resistor can be individually customized.

Another object of the present invention is to provide a method of manufacturing that incorporates a flowable dielectric interposer that flows, surrounding and concentering the conductor-resistor-conductor coupling between mating subassemblies.

Still another object of the present invention is to provide a method of manufacturing the assembly without adversely affecting the resistive connection formed.

Another object of the present invention is to achieve controlled resistive connectivity that minimizes interference by adjacent conductor pairs.

When providing individually tailored resistivity to adjacent interconnections between subassemblies during lamination using a flowable dielectric interposer, precise alignment between substrates and the interposer is critical. Subsequent lamination and connection between substrates and the interposer is also critical. The methodologies used to accomplish such interconnections must be precise, in terms of positional accuracy, as well as in temperatures and accommodating external atmosphere environments. Further, such procedures must be adaptable to mass production to assure competitive cost savings.

In addition to the foregoing alignment factor, it is also imperative that the structures formed be as accurate as possible to satisfy the aforementioned individually tailored resistivity requirements for many of today's products. It is thus essential that if an electronic package is to be utilized, it must be relatively small, capable of providing several individually tailored resistivity connections, and able to be manufactured on a mass production scale.

It is believed, therefore, that an electronic package having the new and unique features defined herein constitutes a significant advancement in the art. It is further believed that methods of making such a package structure as well as larger assemblies incorporating same as part thereof in a facile, relatively inexpensive manner also constitutes significant art advancements.

SUMMARY OF THE INVENTION

The present invention is directed to a circuitized substrate and a dielectric interposer, and more particularly, a drilled dielectric interposer and the placement of a resistor material between two or more subassembly circuitized substrate conductive points to allow individual resistive values to be employed for individual conductive junctions created between the subassemblies upon lamination.

The present invention represents an improvement over methods such as described in the aforementioned patents and applications and otherwise known in the art by teaching the use of drilled dielectric layer(s) as part of a circuitized substrate capable of forming a containment structure between separate substrates as part of a larger multilayered circuitized substrate. Thru-holes in this substrate are positioned such that a resistor paste located therein functions as a resistor between opposing conductors in the final structure. The resistor material is constrained during lamination while the drilled dielectric substrate flows to concenter and surround the conductor-resistor-conductor coupling, without adversely affecting the resistive connection formed. It is believed that an invention possessing such properties as well as others defined herein or discernible from the teachings herein constitutes a significant advancement in the art.

Thus, the present invention overcomes the problems of the conventional methods and structures by using a drilled dielectric capacitor formed as an interposer that may be positioned between two PCBs.

The exemplary aspects of the present invention are designed to solve the problems herein described and other problems not discussed, which are discoverable by a skilled artisan.

BRIEF DESCRIPTION OF THE DRAWINGS

These and other features and advantages of this invention will be more readily understood from the following detailed description of the various aspects of the invention taken in conjunction with the accompanying drawings in which.

DESCRIPTION OF THE PREFERRED EMBODIMENT

Figure 1:
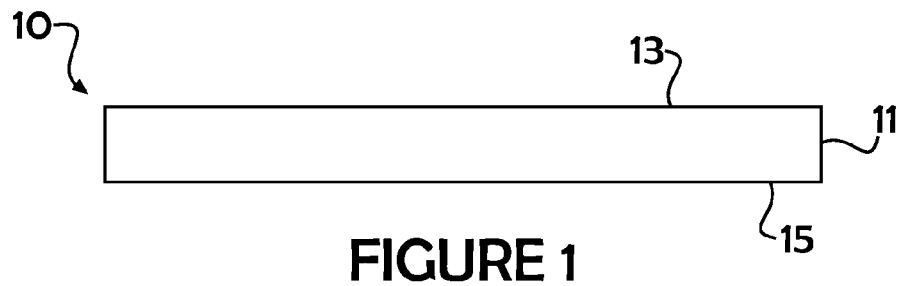
FIGS. 1 through 4 are side elevational views of a dielectric layer.
Figure 2:
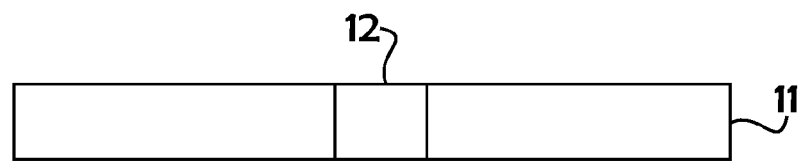
Figure 3:
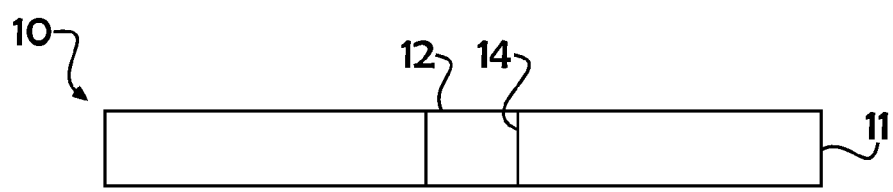
Figure 4:
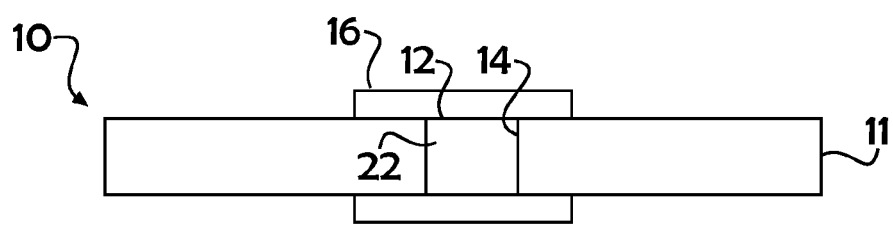

For a better understanding of the present invention, together with other and further objects, advantages and capabilities thereof, reference is made to the following disclosure and appended claims in connection with the above-described drawings. It is understood that like numerals will be used to indicate like elements from drawing FIGURE to drawing FIGURE.

The following are definitions of some of the more significant terms used in this detailed description.

By the term "circuitized substrate" as used herein is meant a substrate structure having at least one (and preferably more) dielectric layer and at least one external conductive layer positioned on the dielectric layer and including a plurality of conductor pads as part thereof. The dielectric layer(s) may be made of one or more of the following dielectric materials: fiberglass-reinforced epoxy resin ("FR-4"); polytetrafluoroethylene (e.g., Teflon), including polytetrafluoroethylene filled with inorganic particles (e.g., silica) as a means of controlling the coefficient of thermal expansion of the dielectric material; polyimide (e.g., Kapton); polyamide; cyanate resin; photo-imageable material; and other like materials. One example of such material known today is sold under the product name "RO2800" by Rogers Corporation, Rogers, Conn. ("RO2800" is a trademark of the Rogers Corporation.) The conductive layer(s) preferably serve to conduct electrical signals, including those of the high frequency type, and is preferably comprised of suitable metals such as copper, but may include or comprise additional metals (e.g., nickel, aluminum, etc.) or alloys thereof.

By the term "circuitized substrate assembly" as used herein is meant to include a structure comprised of two or more circuitized substrates wherein the interposer is placed between the circuitized substrates.

By the term "electroplating" as used herein is meant a process by which a metal in its ionic form is supplied with electrons to form a non-ionic coating on a desired substrate. The most common system involves: a chemical solution which contains the ionic form of the metal, an anode (positively charged) which may consist of the metal being plated (a soluble anode) or an insoluble anode (usually carbon, platinum, titanium, lead, or steel), and finally, a cathode (negatively charged) where electrons are supplied to produce a film of non-ionic metal.

By the term "electroless plating" (also known as chemical or auto-catalytic plating) as used herein is meant a non-galvanic type of plating method that involves several simultaneous reactions in an aqueous solution, which occur without the use of external electrical power. The reaction is accomplished when hydrogen is released by a reducing agent, normally sodium hypophosphite, and oxidized thus producing a negative charge on the surface of the part.

By the term "electronic device" as used herein is meant an integrated circuit (IC) device (e.g., a semiconductor chip).

By the term "electronic package" as used herein is meant a circuitized substrate assembly as taught herein having one or more ICs (e.g., semiconductor chips) positioned thereon and electrically coupled thereto. In a multi-chip electronic package, for example, a processor, a memory device and a logic chip may be utilized and oriented in a manner designed for minimizing the limitation of system operational speed caused by long connection paths. Some examples of such packages, including those with a single chip or a plurality thereof, are also referred to in the art as chip carriers.

By the term "high speed" as used herein is meant signals of high frequency. Examples of such signal frequencies are attainable for the electronic packages taught herein and include those within the range of from about three to about ten gigabits per second (GPS). These examples are not meant to limit this invention, however, because frequencies outside this range, including those higher, may be attainable.

By the term "laser ablation" as used herein is meant the process of removing material from a solid surface by irradiating it with a laser beam. At low laser flux, the material is heated by the absorbed laser energy and evaporates or sublimes. At high laser flux, the material is typically converted to a plasma. The term laser ablation as used herein refers to removing material with a pulsed laser as well as ablating material with a continuous wave laser beam if the laser intensity is high enough.

By the term "interposer" as used herein is meant to include a structure capable of electrically interconnecting arrays of electrical contacts (conductors) found on electronic devices (e.g., semiconductor chips), and arrays of conductors found on larger, hosting substrates such as PCBs, using extremely small conductive elements such as very small solder balls, solder paste, or conductive paste quantities. This is not meant to limit the invention, however, as the interposers formed in accordance with the teachings herein may be used for supplementary interconnecting and constraining means, including, e.g., as a substrate to contain an interconnection between two corresponding circuitized substrates such as two PCBs. Interposers as defined herein are also fully capable of providing successful interconnection between a plurality of chips when these are positioned on the interposer.

Such an interposer, as defined herein, includes at least one dielectric layer and may contain at least one conductive circuit layer wherein the layer includes a high density array of contact locations. Examples of dielectric materials include such materials as fiberglass-reinforced epoxy resins (some referred to as "FR-4" dielectric materials in the art), polytetrafluoroethylene (e.g., Teflon), including polytetrafluoroethylene filled with inorganic particles (e.g., silica) as a means of controlling the coefficient of thermal expansion of the dielectric material, polyimides (e.g., Kapton), polyamides, cyanate resins, polyphenylene ether resins, liquid crystal polymers, photo-imageable materials, and other like materials. If the dielectric materials for the interposer are photo-imageable, this material may be photo-imaged (or photo-patterned), and developed to reveal the desired pattern of openings. The dielectric material may be curtain-coated, spin-coated or screen-applied, or it may be supplied as dry film.

By the term "Kapton" as used herein is meant a polyimide material currently available from E.I. du Pont de Nemours & Company (hereinafter also referred to simply as "du Pont") of Wilmington, Del., and sold under this product name. Kapton is a registered trademark of du Pont.

By the term "pre-preg" as used herein is meant layer of conventional dielectric "pre-preg" material, which usually includes a layer of glass cloth (fiberglass) impregnated with a partially cured material (e.g., a "B-stage" epoxy resin).

By the term "thru-hole" as used herein is meant to include what are also commonly referred to in the industry as "blind vias" which are openings typically from one surface of a substrate to a predetermined distance therein, "internal vias" which are vias or openings located internally of the substrate and are typically formed within one or more internal layers prior to lamination thereof to other layers to form the ultimate structure, and "plated thru-holes" (also known as PTHs), which typically extend through the entire thickness of a substrate. All of these various openings form electrical paths through the substrate and often include one or more conductive layers, e.g., plated copper, thereon. Alternatively, such openings may simply include a quantity of conductive paste or, still further, the paste can be additional to plated metal on the opening sidewalls. These openings in the substrate are formed typically using mechanical drilling or laser ablation, following which the plating and/or conductive paste may be added.

Other definitions are readily ascertainable from the detailed descriptions provided herein.

Referring to FIGS. 1-11, the device and method of the present invention for various exemplary embodiments is described below.

Generally, the present invention takes advantage of fabricating a PCB containing a drilled dielectric interposer. The interposer may include thru-holes that allow the transfer of power, ground and signals from, for example, an underlying substrate to an overlying substrate, the thru-holes containing a resistor material that connects conductive points of the dielectric substrate to the second dielectric substrate, and interconnections among the through vias transferring power and ground to the vias connecting the conductive points of the respective substrates.

Referring now to FIGS. 1 through 4, there is shown a dielectric substrate 10 made from, for example, at least one dielectric layer 11 having a top surface 13 and a bottom surface 15 that may contain circuit traces. Thru-hole 12 is created using techniques such as laser ablation, ion milling, and mechanical drilling to create a void in the dielectric layer 11 that is then cleaned by reactive ion etching (RIE) or chemical etching, well known in the art. A seed layer of electrically conductive material 14 is deposited within each of the thru-holes 12. The preferred conductor for conductor material 14 is copper or copper alloy. Deposition thereof may be accomplished using two deposition procedures, the first being conventional sputtering processing. During such sputtering, a thin layer of the copper metal is vacuum deposited within each thru-hole. Such sputtering may also include depositing a barrier metal layer prior to the copper layer, such a barrier layer typically comprising chrome or titanium with a thickness of 50 angstroms to about 500 angstroms. The sputtered copper layer may then be used as a seed layer for a subsequent electroplating deposition procedure, in which more copper is formed in the thru-hole. Other methods may be used for depositing the copper or copper alloy material 14, including a combined electroless and electroplating process in which the initial copper or copper alloy is deposited using electroless plating (defined above), following which an electroplating procedure (e.g., similar to that above used following the sputtering procedure) is used. Conventional sputtering, electroless and electroplating processes known in the PCB art may be utilized to accomplish the above deposition. Plated thru-hole 22 (PTH) is connected to copper pad 16 that provides a planar surface to receive resistor paste 32 (FIG. 6) prior to stack build-up and lamination.

Figure 5:
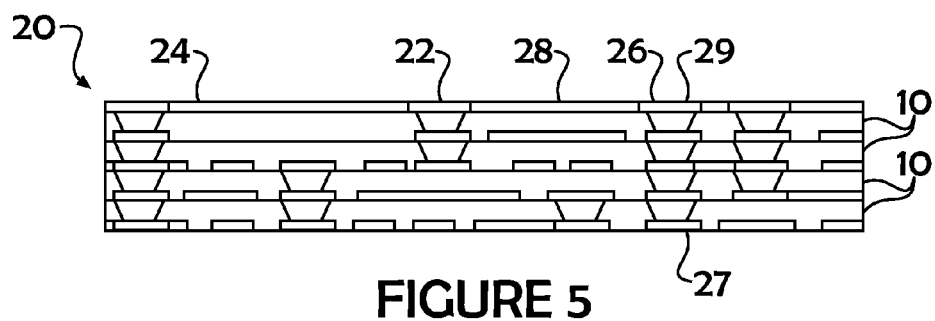
FIG. 5 is a side elevational view of an embodiment of the dielectric layer.

Referring now to FIG. 5, there is shown a multilayer dielectric substrate 20 comprising multiple single layer dielectric substrates 10 laminated together to form the multilayer dielectric substrate 20. Multilayer dielectric substrate 20 contains aligned PTH 26 that passes completely through the substrate 20 to connect the bottom surface 27 to the top surface 29, utilizing adhesive paste 28 during lamination to achieve an electrical connection between adjacent substrate layers 10. As seen in this view, copper pad 22 is analogous to copper trace 24, that each are conducting features. These features can be part of the build-up of a PCB that may contain copper foil cladding or other metal layer on the dielectric substrate layer 10 that can be added or removed to create circuit traces 22 and 24 on dielectric layer 11, as known in the art.

Figure 6:
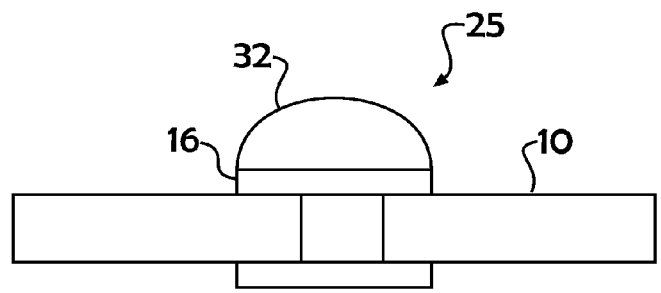
FIG. 6 is a side elevational view of the dielectric layer shown in FIG. 4 with resistive paste applied.

Referring now to FIG. 6, resistor paste 32 is shown on the single layer dielectric substrate 10 to create a dielectric substrate subassembly 25, whereby resistor paste 32 is applied in paste form using a screen-printing, stencil, dispensing operation, or, in an ink form using an ink-jet printing operation to place a predetermined amount of paste 32 on copper pad 16. Deposition of resistor paste 32 is accomplished by placement on copper pad 16 connected to PTH 22, as shown. In alternate embodiments, resistor paste 32 could be applied to microvias and circuitized substrate pads (not shown). Resistor paste 32 is typically a carbon-based paste and potentially able to combine nanoparticle, carbon nanotube, metallic nanotube, mixed metal, alloy, and metal-ceramic paste or combinations thereof. Resistor paste can use epoxy or any other polymer system. Examples of polymer materials include epoxy resins, polytetrafluoroethylene (e.g., Teflon), polyimides, polyamides, cyanate resins, polyphenylene ether resins, photo-imageable materials, and other like materials.

Figure 7:
FIGS. 7 and 8 are side elevational view of a dielectric interposer.
Figure 8:
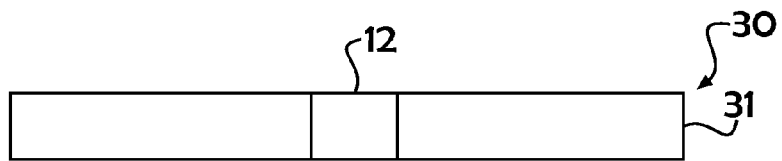

Referring now to FIGS. 7-8, interposer 30 is made from a pre-preg material 31, which is a flowable material during the lamination process, allowing it to flow and serve as a containment mechanism for resistor paste 32 during lamination. Pre-preg 31 is drilled to create thru-holes 12, again created using techniques such as laser ablation, ion milling, and mechanical drilling to create a void in the pre-preg layer 31 that is then cleaned by RIE or chemical etching, well known in the art. The interposer 30 as used in this embodiment is simply a pre-preg material 31 with thru-holes 12 drilled through. It does not contain circuit traces or PTHs. However, it may contain more than one layer 31 to achieve the desired thickness needed to contain resistor paste 32.

Figure 9:
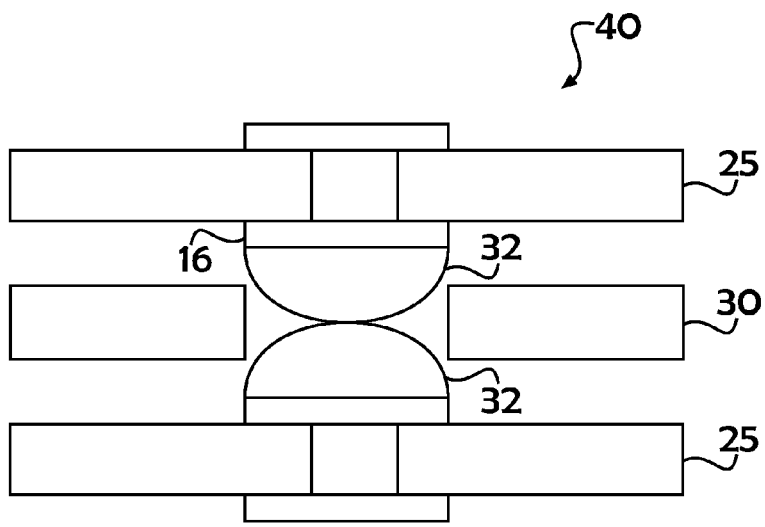
FIGS. 9 and 10 are side views of embodiments of a circuit board assembly with the dielectric interposer shown in FIGS. 7 and 8 and resistor paste covered conductive subassemblies.
Figure 10:
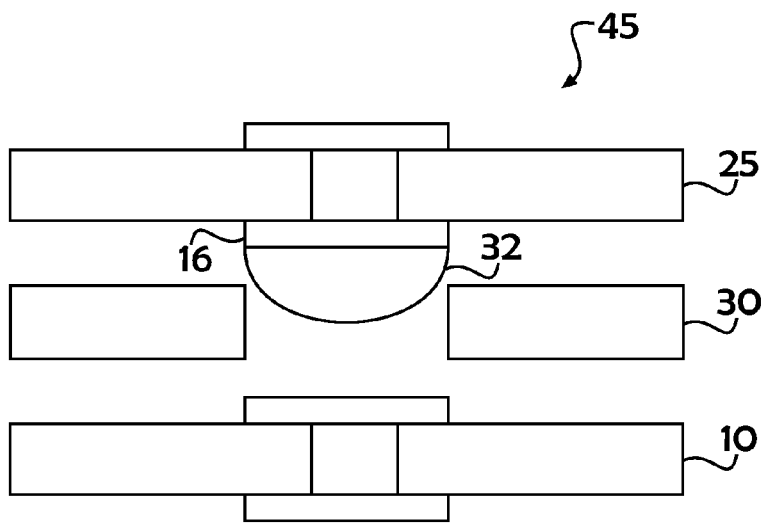

Referring now to FIGS. 9 and 10, there are shown two embodiments of the PCB interposer subassembly 40 (FIG. 9) and 45 (FIG. 10) prior to lamination, wherein PCB interposer subassembly 40 comprises two dielectric substrate subassemblies 25 laminated together with interposer 30. The two dielectric substrate subassemblies 25 are aligned, with their facing measured portions of resistor paste 32, combining with thru-hole 12 of interposer 30. During lamination, a pocket of space retains and constrains the measured portion of resistor paste 32 from leaching or spreading outside the boundaries of copper pad 16, thereby does not adversely affecting adjacent connections (not shown).

The thru-hole 12 of interposer 30 is created to ensure that the predetermined amount of resistor paste 32 applied to single layer dielectric substrates 10 is held in place to create a customizable resistive connection. Variations in the compositions of the resistive paste 32, the diameter and height of the thru-hole 12 in interposer 30, and the thickness of the resistor paste 32, all described hereinabove, can combine to create an individually tailored resistor value for each conductor-resistor-conductor coupling contained within layers 10, 20, 25, and 30 of PCB interposer assembly 50 (FIG. 11).

FIG. 10 is a depiction of a second embodiment of the PCB interposer subassembly 45, and is similar to PCB interposer subassembly 40 (FIG. 9), but in place of two dielectric substrate subassemblies 25 and interposer 30, one dielectric substrate 10, one dielectric substrate subassembly 25, and interposer 30 are combined together during lamination. This may result from resistive requirement specifications. Across the PCB interposer subassembly 45 the composition of resistive paste 32, the diameter of thru-hole 12 in interposer 30, and the thickness of the resistor paste 32 can meet such specifications with the application of the resistor paste 32 to a single side of the component PCB interposer subassembly 45, namely dielectric substrate subassembly 25.

Figure 11:
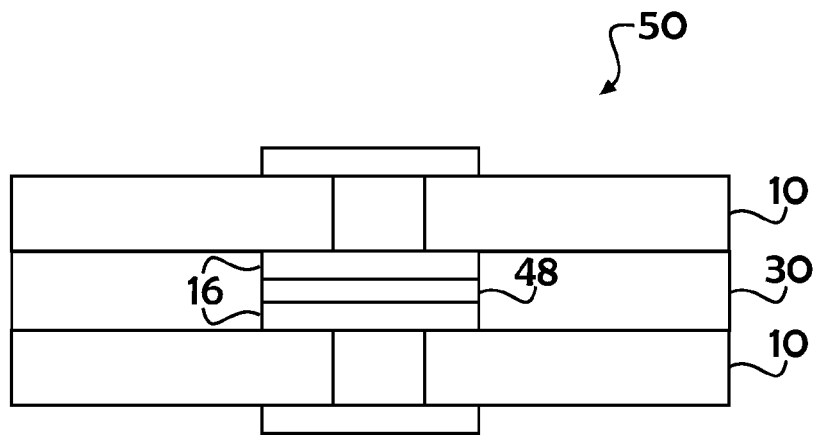
FIG. 11 is a side view of a laminated circuit board assembly in accordance with the invention.

Referring now to FIG. 11, there is shown the desired laminated structure of PCB interposer assembly 50 containing the conductor 16, resistor 48, and conductor 16 coupling. During lamination, thru-hole 12 of interposer 30 constrains the movement of resistor paste 32 as the temperature and pressure of the lamination process progresses. The pre-preg material 31 of interposer 30 attains a semi-liquid state at elevated temperature and pressure and therefore flows and fills in any gaps remaining within the void area of thru-hole 12, and ensures encapsulation and containment of resistor paste 32 during lamination. In one embodiment, resistor paste 32 and pre-preg material 31 of interposer 30 uses the same resin mixed with each other during lamination.

In various exemplary embodiments, the foregoing dielectric layers may be chosen from PCB, laminate chip carrier (LCC), or others as is known. Such layers 11 in the described embodiment are polytetrafluoroethylene (e.g., Teflon), including polytetrafluoroethylene filled with inorganic particles (e.g., silica) as a means of controlling the coefficient of thermal expansion of the dielectric material. One example of such material known today is sold under the product name "RO2800" by Rogers Corporation, Rogers, Conn. ("RO2800" is a trademark of the Rogers Corporation.) The interposer must be a flowable dielectric material.

In various exemplary embodiments, a hierarchy of resistor paste 32, having different resistive properties, may be used to connect, for example, dielectric substrate subassembly 25 on one side of the interposer 30 to a dielectric substrate 10 on the other side of the interposer 30 with custom resistance values of each individual connection.

In one embodiment (FIG. 9), subassembly 25 is made with high temperature liquid crystal polymer core (e.g., Rogers Ultralam 3850) and interposer 30 is made with low temperature melt liquid crystal polymer (e.g., Rogers Ultralam 3908 bondply). It is also possible to use polytetrafluoroethylene (e.g., Teflon) with the polyimides-based core as subassembly 25 and low temperature liquid crystal polymer (e.g. Rogers Ultralam 3908 bondply) as the interposer 30.

Figure 12:
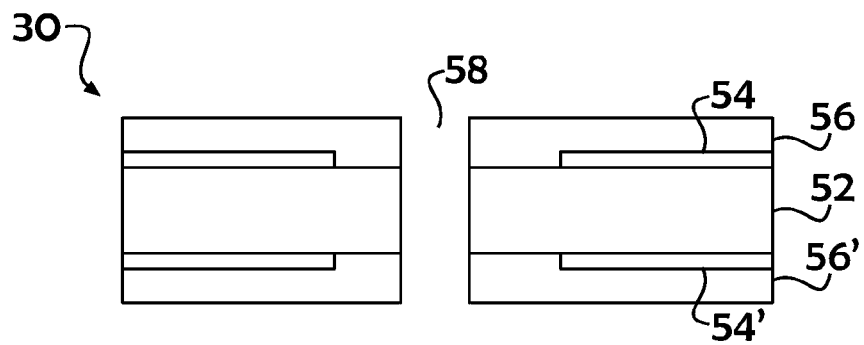
FIG. 12 depicts a capacitance layer with top and bottom Cu electrodes sandwiched between two B-staged dielectric layers.

It is possible to use an interposer 30 made with a capacitance layer in the middle and B-staged dielectric as the outer layers. In FIG. 12, capacitance layer 52 has top and bottom Cu electrodes 54, 54' sandwiched between two B-staged dielectric layers 56, 56'. Thru-holes 58 are drilled through the interposer 30.

Figure 13:
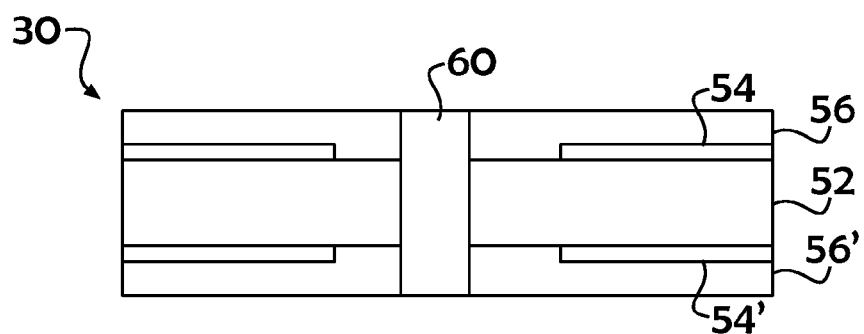
FIG. 13 represents a resistor paste-filled interposer with a capacitance layer therebetween.

FIG. 13 represents a resistor paste filled interposer with a capacitance layer in the middle. Here, opening 58 is filled with resistor paste 60.

Figure 14:
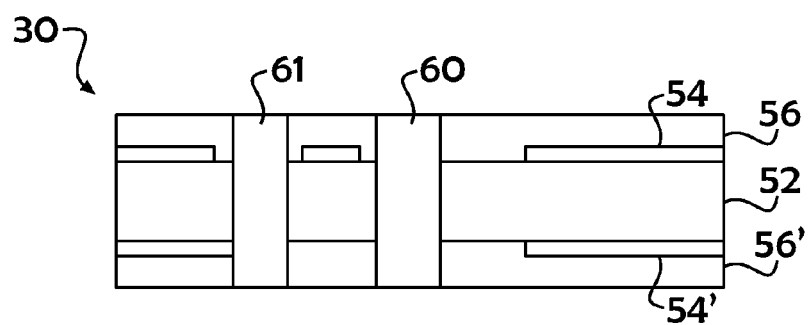
FIG. 14 depicts an interposer having openings filled with resistor paste and electrically conductive adhesives.

It is also possible that the interposer opening can have multiple materials. In one example (FIG. 14) some openings are filled with resistor paste and rest of the openings are filled with electrically conductive adhesives (ECA) to make electrical connection between adjacent surfaces. ECA can be used to connect capacitor electrodes. It is also possible that openings filled with electrically conductive adhesives can be plated thru-holes. But there is no plated opening for resistor paste. For multiple materials, it is preferable to drill the openings separately. For example, resistor paste filled openings and electrically conductive adhesive filled openings can be drilled separately.

Figure 15:
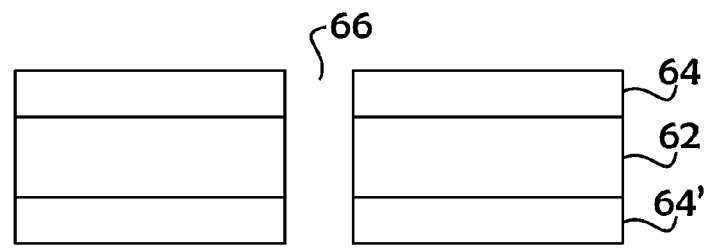
FIG. 15 shows a pre-preg with a multilayer polymer resin structure, the top and bottom layers being partially cured or B-staged.

In another example, pre-preg 31 can be a multilayer polymer resin structure (FIG. 15) where the top and bottom layers are uncured or B-staged. The middle layer is cured. DuPont Pyralux (LF111) has been used, 1 mil cured polyimide being sandwiched between 1 mil adhesives. In another example, a high temperature melt LCP core (e.g., Rogers Ultralam 3850) is placed in the middle and low temperature melt LCP (e.g. Rogers Ultralam 3908 bondply) is used as outside layers. In another example, Rogers 2800 is the middle and LCP (e.g., Rogers Ultralam 3908 bondply) or an adhesive layer or a B-staged resin or a B-staged filled resin is the outside surfaces. Furthermore, a high temperature melt LCP core (e.g., Rogers Ultralam 3850) can be disposed in the middle and an adhesive layer or B-staged resin or B-staged filled resin is the outside surfaces.

Figure 16:
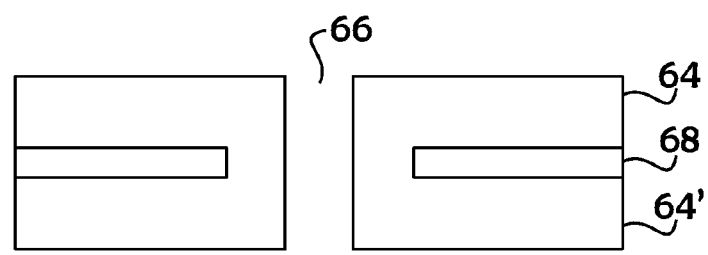
FIG. 16 depicts an interposer joining core, the cured polymer being replaced by a Cu layer.

Interposer can be a joining core where cured polymer can be replaced by a Cu layer (FIG. 16).

Figure 17:
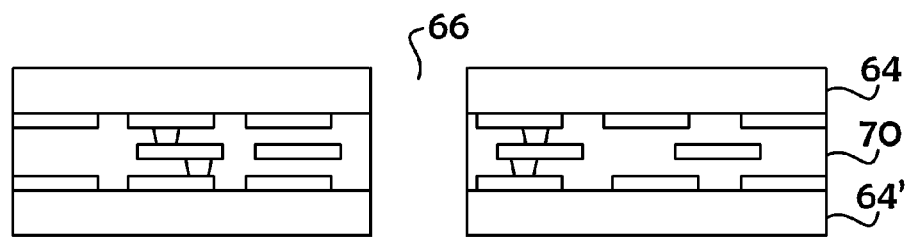
FIG. 17 depicts an interposer with multilayer core, the top and bottom layers being partially cured or B-staged dielectric material.
Figure 18:
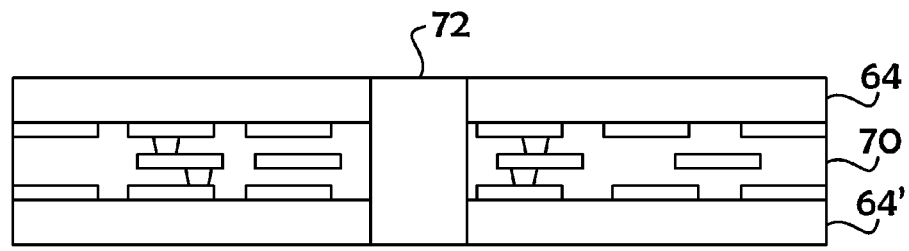
FIG. 18 shows openings in the interposer filled with resistor paste and electrically conductive adhesives.

FIGS. 17 and 18 represent an interposer with multilayer core where top and bottom layers are made with uncured or B-staged dielectric material. Top and bottom surfaces do not contain any circuitry. Interposer contains several signal, voltage, power planes, micro vias etc. It is also possible that interposer openings can have multiple materials. In one example some openings are filled with resistor paste and the rest of the openings are filled with electrically conductive adhesives (ECA) to make electrical connection between adjacent surfaces. Openings filled with electrically conductive adhesives can be plated thru-holes. But there are no plated openings for resistor paste. Electrically conductive adhesive filled plated thru-holes can be electrically connected to the inner planes of multilayer core.

Since other combinations, modifications and changes varied to fit particular operating requirements and environments will be apparent to those skilled in the art, the invention is not considered limited to the chosen preferred embodiments for purposes of this disclosure, but covers all changes and modifications which do not constitute departures from the true spirit and scope of this invention.

Having thus described the invention, what is desired to be protected by Letters Patent is presented in the subsequently appended claims.

What is claimed is:

1. A circuitized substrate comprising:
a) a first printed circuit board (PCB) layer having a first plurality of conductive features, each of said conductive features having a predetermined dimension;
b) a dielectric interposer positioned on said first PCB layer;
c) a second PCB layer having a second plurality of conductive features further positioned on said dielectric interposer; and
d) a plurality of thru-holes extending through said dielectric interposer layer, each of said plurality of thru-holes having a diameter greater than said predetermined conductive feature dimension, resulting in a pocket of space proximate said plurality of conductive features, and each of said plurality of thru-holes being in alignment with a respective one of said first and said second plurality of conductive features on said first and said second PCB layers, respectively, and including a portion of laminated, electrically resistive paste thereon, said laminated electrically resistive paste being spread outside boundaries of said plurality of conductive features to fill said pockets of space, said electrically resistive paste having an adjustable resistivity factor.

2. The circuitized substrate of claim 1, wherein said electrically conductive features on said first and said second PCB layers comprise copper or copper alloy.

3. The circuitized substrate of claim 1, further comprising at least one electrical component electrically coupled to said circuitized substrate assembly.

4. The circuitized substrate of claim 3, wherein said at least one electrical component comprises a semiconductor chip.

5. The circuitized substrate of claim 4, wherein said electrical components are selected from the group: IC chips, memory, and ASICs.

6. The circuitized substrate of claim 1, wherein said dielectric interposer comprises low temperature liquid crystal polymer.

7. The circuitized substrate of claim 1, wherein said dielectric interposer a capacitance layer in the middle thereof and B-staged dielectric as outer layers thereof.

8. The circuitized substrate of claim 1, wherein said dielectric interposer comprises a capacitance layer in the middle thereof and wherein said plurality of thru-holes is filled with said resistive paste.

9. The circuitized substrate of claim 1, wherein a portion of said plurality of thru-holes is filled with resistive paste and another portion of said plurality of thru-holes is filled with electrically conductive adhesives (ECA) to make electrical connection between adjacent surfaces.

10. The circuitized substrate of claim 1, wherein said first PCB layer comprises a multilayer polymer resin structure, the top and bottom layers thereof being uncured or B-staged material.

* * * * *